United States Patent

Kuwajima et al.

[11] Patent Number: 5,951,918
[45] Date of Patent: Sep. 14, 1999

[54] COMPOSITE ELECTROCONDUCTIVE POWDER, ELECTROCONDUCTIVE PASTE, PROCESS FOR PRODUCING ELECTROCONDUCTIVE PASTE, ELECTRIC CIRCUIT AND PROCESS FOR PRODUCING ELECTRIC CIRCUIT

[75] Inventors: Hideji Kuwajima, Hitachinaka; Shozo Yamana; Junichi Kikuchi, both of Hitachi; Hisashi Dokochi, Mito; Toshikazu Ono, Hitachi; Yoshikatsu Mikami, Shimodate; Hiroshi Wada, Hitachinaka, all of Japan

[73] Assignee: Hitachi Chemical Company, Ltd., Tokyo, Japan

[21] Appl. No.: 08/875,779

[22] PCT Filed: Feb. 8, 1996

[86] PCT No.: PCT/JP96/00271

§ 371 Date: Aug. 5, 1997

§ 102(e) Date: Aug. 5, 1997

[87] PCT Pub. No.: WO96/24938

PCT Pub. Date: Aug. 15, 1996

[30] Foreign Application Priority Data

Feb. 8, 1995 [JP] Japan .................................. 7-020268
Feb. 8, 1995 [JP] Japan .................................. 7-020269
Mar. 7, 1995 [JP] Japan .................................. 7-046953
Jun. 7, 1995 [JP] Japan .................................. 7-140495
Jul. 18, 1995 [JP] Japan .................................. 7-181473

[51] Int. Cl.[6] .............................. H01B 1/02; H01B 1/22; B22F 1/02; B05D 5/12
[52] U.S. Cl. ............................. 252/514; 75/255; 427/96; 427/125; 427/372.2; 174/257
[58] Field of Search ...................... 252/512, 514; 75/255; 428/403; 427/96, 125, 372.2; 174/250, 257; 439/55

[56] References Cited

U.S. PATENT DOCUMENTS

| | | | |
|---|---|---|---|
| 3,767,519 | 10/1973 | Kojima et al. | 161/168 |
| 4,496,475 | 1/1985 | Abrams | 252/514 |
| 4,652,465 | 3/1987 | Koto et al. | 427/216 |
| 4,827,083 | 5/1989 | Inasaka et al. | 174/68.5 |
| 5,045,141 | 9/1991 | Salensky et al. | 156/240 |
| 5,326,636 | 7/1994 | Durand et al. | 428/323 |

*Primary Examiner*—Mark Kopec
*Attorney, Agent, or Firm*—Antonelli, Terry, Stout & Kraus, LLP

[57] ABSTRACT

An electroconductive paste for forming an electric circuit which is low in resistivity, high in electroconductivity and minimized in change of resistivity even after a thermal shock test and/or a humidity and DC applied test, can be obtained by using a composite electroconductive powder comprising a flake-like electroconductive powder made of a material such as silver, a silver alloy, a silver-coated copper powder or a silver-coated copper alloy powder and an unsteady-shaped electroconductive powder such as a reduced silver powder. Also, by using a composite electroconductive powder comprising an electroconductive powder having an aspect ratio of 6 or greater and an electroconductive powder having an aspect ratio of 5 or less, there can be obtained an electroconductive paste which is low in resistivity, high in electroconductivity, minimized in change of resistivity even after a thermal shock test and/or a humidity and DC applied test, and capable of improving probability of contact between the electroconductive powder particles, elevating electroconductivity of the electric circuit, and also raising electroconductivity especially when a circuit is printed on a sheet-like substrate and the printed circuit is pressed. The electric circuit formed on the surface of a substrate by using such an electroconductive paste is low in resistivity, high in electroconductivity and also excellent in migration resistance.

28 Claims, 3 Drawing Sheets

COMPOSITE ELECTROCONDUCTIVE POWDER, ELECTROCONDUCTIVE PASTE, PROCESS FOR PRODUCING ELECTROCONDUCTIVE PASTE, ELECTRIC CIRCUIT AND PROCESS FOR PRODUCING ELECTRIC CIRCUIT

TECHNICAL FIELD

The present invention relates to a composite electroconductive powder, an electroconductive paste, a process for producing an electroconductive paste, an electric circuit and a process for producing an electric circuit.

BACKGROUND ART

As processes for forming electric circuits (wiring conductors) of printed wiring boards, electronic parts and such, there has generally been known a method which comprises coating or printing an electroconductive paste containing silver powder with excellent conductivity as described on pages 42–46 of the October 1994 issue of Denshi Zairyo (Electronic Materials).

Due to their good electroconductivity, the electroconductive pastes containing silver powder have been used for forming electric circuits and electrodes of the printed wiring boards, electronic parts and such. However, the volume resistivity (specific resistance) of the electric circuits formed by using these electroconductive pastes usually fall in the range of 50 to 100 $\mu\Omega\cdot$cm, and may reach only 30–40 $\mu\Omega\cdot$cm at best, so that although it may cause few problems in case the length of the printed circuits was small, such as several cm or less, troubles were apt to arise when the circuit length was made 10 cm or longer due to an increase of conductor resistance.

For obtaining a conductor with good conductor resistance, the content of silver power is increased, but it is hardly possible to obtain stably a specific resistance, or resistivity, of 25 $\mu\Omega\cdot$cm or less by this means. Simple increase of the silver powder content gives rise to problems such as upset balance with other properties such as adhesiveness.

The method comprising etching of a metal foil such as silver or copper foil can provide a high electroconductivity and a low resistivity on the order of several $\mu\Omega\cdot$cm, but this method has a disadvantage in that it elevates the production cost as the process is complicated. Also, the electroconductive pastes using silver powder have a defect in that when an electric field is applied under a high-temperature and high-humidity atmosphere, there takes place a phenomenon called migration and resulting electrodeposition of silver between the wiring conductors and electrodes to cause short circuiting between the electrodes or the wires. For preventing such migration, several measures have been taken or are under study, such as coating the conductor surfaces with a moisture proof coating material or adding a corrosion inhibitor such as a nitrogen-containing compound to the electroconductive paste, but no satisfactory effect has ever been obtained with these measures.

It is also suggested to use silver-palladium alloy powder in place of silver powder for preventing migration. However, such alloy powder is costly as compared with silver powder, and although it is practically used for the small-sized wiring boards, such as those for hybrid IC, but it has not yet been practically applied to the substrates of the large-sized wiring boards, such as paper phenol substrate, glass epoxy substrate and polyethylene terephthalate substrate. Use of silver-coated copper powder can improve the migration problem and makes it possible to obtain an inexpensive electroconductive paste, but when silver coating is applied uniformly and thickly, no migration improving effect is produced. Plating is an economical way for coating; for instance silver plating on an inexpensive spherical copper powder can be easily performed with minimized possibility of flocculation, but this method has a disadvantage in that the electroconductive paste using such silver-plated powder is increased in resistance.

An object of the present invention, therefore, is to provide a composite electroconductive powder which is capable of producing an electroconductive paste for forming electric circuits which is low in resistivity, high in electroconductivity and minimized in change of resistivity even after a thermal shock test and/or a humidity and DC applied test.

Another object of the present invention is to provide a composite electroconductive powder capable of producing an electroconductive paste which is particularly excellent in electroconductivity and also excellent in oxidation resistance and heat resistance.

Still another object of the present invention is to provide a composite electroconductive powder capable of producing an electroconductive paste having an anchoring effect when pressed.

Yet another object of the present invention is to provide a composite electroconductive powder capable of producing an electroconductive paste for forming electric circuits which is low in resistivity, high in conductivity and excellent in migration resistance.

A further object of the present invention is to provide a composite electroconductive powder capable of producing an electroconductive paste which is low in resistivity, high in conductivity, minimized in change of resistivity even after a thermal shock test and a humidity and DC applied test, and capable of improving the probability of contact between the electroconductive powder particles, elevating electroconductivity of the electric circuits and also boosting electroconductivity particularly when a circuit is printed on a sheet-like substrate and the printed circuit is pressed.

Another object of the present invention is to provide an electroconductive paste for forming electric circuits which is low in resistivity, high in electroconductivity and minimized in change of resistivity even after a thermal shock test and/or a humidity and DC applied test.

Still another object of the present invention is to provide an electroconductive paste for forming electric circuits which is low in resistivity, capable of improving the probability of contact between the electroconductive powder particles and elevating electroconductivity of the electric circuits, and also excellent in migration resistance.

Still another object of the present invention is to provide an electric circuit which is low in resistivity, high in electroconductivity and excellent in migration resistance.

Yet another object of the present invention is to provide an electric circuit suited for forming fine circuits.

A further object of the present invention is to provide a process for producing an electric circuit which is low in resistivity, high in electroconductivity and excellent in migration resistance.

An additional object of the present invention is to provide a process for producing an electric circuit suited for forming fine circuits.

DISCLOSURE OF INVENTION

The present invention relates to the following matters:
(1) A composite electroconductive powder comprising a flake-like electroconductive powder and an unsteady-shaped electroconductive powder.

(2) A composite electroconductive powder set forth in (1) above wherein the flake-like electroconductive powder is composed of silver, a silver alloy or a silver-coated conductor.

(3) A composite electroconductive powder set forth in (1) above wherein the flake-like electroconductive powder is a flake-like silver-coated conductor powder.

(4) A composite electroconductive powder set forth in (3) above wherein the flake-like silver-coated conductor powder is a silver-coated copper powder or a silver-coated copper alloy powder.

(5) A composite electroconductive powder set forth in (3) or (4) above wherein the flake-like silver-coated conductor powder is a silver-coated copper powder with the copper powder partly exposed.

(6) A composite electroconductive powder set forth in any one of (1) to (5) above wherein the unsteady-shaped electroconductive powder is composed of silver or a silver alloy.

(7) A composite electroconductive powder set forth in (6) above wherein the unsteady-shaped electroconductive powder is a reduced silver powder.

(8) A composite electroconductive powder set forth in (6) above wherein the unsteady-shaped electroconductive powder is composed of a conductor having a higher hardness than silver or silver alloys and coated with silver.

(9) A composite electroconductive powder set forth in (8) above wherein the conductor having a higher hardness than silver or silver alloys is a powder of Co, Ni, Cr, Cu, W or an alloy thereof.

(10) A composite electroconductive powder set forth in (9) above wherein the conductor having a higher hardness than silver or silver alloys is a copper powder or a copper alloy powder.

(11) A composite electroconductive powder set forth in any one of (8) to (10) above wherein the unsteady-shaped electroconductive powder is a silver-coated copper powder or a silver-coated copper alloy powder with the copper or copper alloy powder partly exposed.

(12) A composite electroconductive powder comprising an electroconductive powder having an aspect ratio of 6 or greater and an electroconductive powder having an aspect ratio of 5 or less.

(13) A composite electroconductive powder set forth in (12) above wherein the electroconductive powder having an aspect ratio of 6 or greater is composed of silver, a silver alloy or a silver-coated conductor.

(14) A composite electroconductive powder set forth in (12) above wherein the electroconductive powder having an aspect ratio of 6 or greater is a silver-coated conductor powder having an aspect ratio of 6 or greater.

(15) A composite electroconductive powder set forth in (14) above wherein the silver-coated conductor powder having an aspect ratio of 6 or greater is a silver-coated copper powder or a silver-coated copper alloy powder.

(16) A composite electroconductive powder set forth in (14) or (15) above wherein the silver-coated conductor powder having an aspect ratio of 6 or greater is a silver-coated copper powder or a silver-coated copper alloy powder with the copper or copper alloy powder partly exposed.

(17) A composite electroconductive powder set forth in any one of (12) to (16) above wherein the electroconductive powder having an aspect ratio of 5 or less is composed of silver or a silver alloy.

(18) A composite electroconductive powder set forth in (17) above wherein the electroconductive powder having an aspect ratio of 5 or less is a reduced silver powder.

(19) A composite electroconductive powder set forth in (17) above wherein the electroconductive powder having an aspect ratio of 5 or less is a conductor having a higher hardness than silver or silver alloys and coated with silver.

(20) A composite electroconductive powder set forth in (19) above wherein the conductor having a higher hardness than silver or silver alloys is a powder of Co, Ni, Cr, Cu, W or an alloy thereof.

(21) A composite electroconductive powder set forth in (19) above wherein the conductor having a higher hardness than silver or silver alloys is a copper powder or a copper alloy powder.

(22) A composite electroconductive powder set forth in any one of (19) to (21) above wherein the unsteady-shaped electroconductive powder is a silver-coated copper powder with the copper powder partly exposed.

(23) An electroconductive paste comprising a composite electroconductive powder set forth in any one of (1) to (22) above, a binder and a solvent.

(24) An electroconductive paste set forth in (23) above wherein the composite electroconductive powder is contained in an amount of 85–93% by weight based on the solids of the electroconductive paste.

(25) An electroconductive paste set forth in (23) or (24) above comprising a composite electroconductive powder set forth in any one of (1) to (11) above, a binder and a solvent, wherein the unsteady-shaped electroconductive powder is contained in an amount of 5–50% by weight as against 95–50% by weight of the flake-like electroconductive powder.

(26) An electroconductive paste set forth in (23) or (24) above comprising a composite electroconductive powder set forth in any one of (12) to (22) above, a binder and a solvent, wherein the electroconductive powder having an aspect ratio of 5 or less is contained in an amount of 5–50% by weight as against 95–50% by weight of the electroconductive powder having an aspect ratio of 6 or greater.

(27) An electric circuit formed on the surface of a substrate made by using an electroconductive paste set forth in any one of (23) to (26) above.

(28) An electric circuit set forth in (27) above wherein the resistivity of the electric circuit formed on the substrate surface is 25 $\mu\Omega$·cm or less.

(29) A process for making an electric circuit which comprises forming a circuit pattern with an electroconductive paste set forth in any one of (23) to (26) above on the surface of a substrate, and then pressing and curing the paste.

(30) A process for making an electric circuit set forth in (29) above wherein the resistivity of the electric circuit formed on the substrate surface is 25 $\mu\Omega$·cm or less.

BEST MODE FOR CARRYING OUT THE INVENTION

Figure 1:
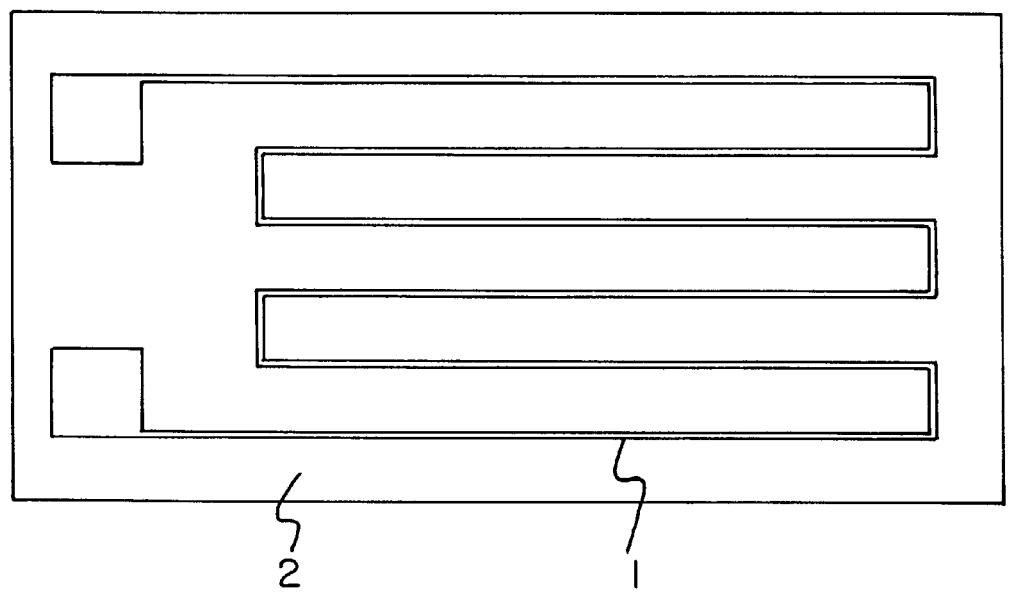
FIG. 1 is a plane view showing a state where a silver conductor circuit has been printed on a polyethylene terephthalate film. Reference numeral 1 designates a silver conductor circuit, and 2 a polyethylene terephthalate film.

In the present invention, in the case of a combination of a flake-like electroconductive powder and an unsteady-shaped electroconductive powder or a combination of an electroconductive powder having an aspect ratio of 6 or greater and an electroconductive powder having an aspect ratio of 5 or less, the probability of contact between the electroconductive powders can be improved and electroconductivity of the electric circuit is elevated, especially in case the circuit is printed on a sheet-like substrate and the printed circuit is pressed.

The "aspect ratio" of an electroconductive powder referred to in the present invention means the ratio of the major diameter to the minor diameter (major diameter/minor diameter) of the electroconductive powder particles. In the present invention, the electroconductive powder particles are mixed well in a curable resin of a low viscosity, the mixture is allowed to stand, letting the powder particles settle down while allowing the resin to cure, and the obtained cured product is cut in the vertical direction. The shapes of the particles appearing on the cut section are observed under an electron microscope, and the major diameter/minor diameter ratio of every one of at least 100 randomly picked up particles is determined. The mean value of the determinations is given as aspect ratio.

Here, the "minor diameter" is the distance between the two particle-holding parallel lines which are the smallest in spacing in the combinations of the two parallel lines which hold therebetween the particles appearing on said cut section, with each line contacting the outside of a particle. On the other hand, the "major diameter" is the distance between the two particle-holding parallel lines which are the largest in spacing in the combinations of the two parallel lines holding the particles therebetween and contacting the outsides of the particles, these parallel lines being orthogonal to those which determine the minor diameter mentioned above. The rectangle defined by these four lines provides a space in which a particle just fits.

The concrete method employed in the present invention will be described later.

The "flake-like electroconductive powder" refers to an electroconductive powder comprising fine particles which are substantially flaky in shape, for instance, a flaky electroconductive powder. The "unsteady-shaped electroconductive powder" refers to electroconductive powders of various shapes other than flake-like, which include, for example, spherical, cubic, tetrahedral, briquet or semispherical powders, the powders having projections on the surface like confetti, and mixtures of these powders. An example of the mixed electroconductive powders containing the powders of various shapes is a reduced silver powder.

An electroconductive powder having an aspect ratio of 6 or greater and the one having an aspect ratio of 5 or less can be used as the flake-like electroconductive powder and the unsteady-shaped electroconductive powder, respectively.

The flake-like electroconductive powders are, in many cases, suited for use as an electroconductive powder having an aspect ratio of 6 or greater. This type of electroconductive powder also includes so-called dendrite powder, and this powder may be used in combination with flake-like electroconductive powders. As the electroconductive powder having an aspect ratio of 6 or greater, it is desirable to use a powder having an aspect ratio of 7 or greater, more preferably 8 or greater, even more preferably 10 or greater, as a high-electroconductivity paste can be obtained with these powders. Thus, when considered from both facets of shape and aspect ratio, it is desirable to use a flake-like electroconductive powder having an aspect ratio of 7 or greater, more preferably a flake-like electroconductive powder having an aspect ratio of 8 or greater, most preferably a flake-like electroconductive powder having an aspect ratio of 10 or greater, in view of such matters as high electroconductivity and viscosity of the electroconductive paste.

The average diameter of the particles of the flake-like electroconductive powder or the powder having an aspect ratio of 6 or greater is preferably 25 $\mu$m or less, more preferably 20 $\mu$m or less, even more preferably 10 $\mu$m or less, from the viewpoint of retained printability. The average particle diameter referred to herein can be measured by a laser scattering type particle size distribution meter. In the present invention, Master-Sizer (mfd. by Malvern Instruments, Ltd.) was used for measuring the average particle diameter.

Most of said unsteady-shaped electroconductive powders are applicable as the electroconductive powder having an aspect ratio of 5 or less. As the electroconductive powder with an aspect ratio of 5 or less, it is desirable that the aspect ratio is 4 or less, more preferably 3 or less, even more preferably 2.5 or less, as a high-electroconductivity paste can be obtained.

The average particle diameter of the unsteady-shaped electroconductive powder or the powder having an aspect ratio of 5 or less is preferably in the range of 3–20 $\mu$m, more preferably in the range of 3–10 $\mu$m, for the reason of better printability. The average particle diameter referred to herein can be measured by a laser scattering type particle size distribution meter as in the above case. In the present invention, Master-Sizer (mfd. by Malvern Instruments Ltd.) was used for the measurement.

As the material of the electroconductive powders, silver or a silver alloy is preferred from the viewpoint of conductivity and oxidation resistance.

As said silver alloy, it is preferable to use an alloy with palladium (for example, about 1–5 wt % in the silver alloy) or platinum (for example, about 1 wt % in the silver alloy).

Reduction-in-liquid phase technique is known as one of the methods for making said silver powder. Since the silver powder produced by this method is a fine powder of several $\mu$m in average particle diameter, this method is widely utilized as an industrial powder production method. This reduction-in-liquid phase technique is a method in which silver is dissolved with an acid, then neutralized with an alkali and reduced in liquid by adding a reducing agent such as formalin or starch, followed by pulverization. The powder obtained by this method is called reduced silver powder, and its shape, although close to lump, is not constant but irregular. This reduced silver powder can be used in the present invention as an unsteady-shaped electroconductive powder or an electroconductive powder having an aspect ratio of 5 or less.

As the electroconductive powders, there can also be used silver-coated electroconductive powders produced by coating an electroconductive material, which is not silver or a silver alloy, with silver or a silver alloy.

Such silver-coated electroconductive powders can also be used as the unsteady-shaped electroconductive powder, but in this case, the electroconductive material to be coated is preferably the one having a higher hardness than silver or silver alloys. As such electroconductive material, there can be used such metals as Co, Ni, Cr, Cu and W or alloys thereof in powdery form, of which copper powder or copper alloy powder is preferred.

Use of such an electroconductor powder is desirable because when the formed electric circuit is pressed, the unsteady-shaped electroconductive powder is allowed to get into the flake-like silver or silver alloy powder to elevate electroconductivity of the electric circuit.

As said copper alloy powder, there can be used, for instance, a copper and tin alloy powder or a copper and zinc alloy powder.

Such methods as substitution plating, electroplating and electroless plating are available for coating the particle surfaces of the unsteady-shaped electroconductive powder or the powder having an aspect ratio of 5 or less with silver, but substitution plating is preferred because of high adhesion between the unsteady-shaped electroconductive powder or the powder having an aspect ratio of 5 or less and silver and low running cost. The coating weight of silver on the particle surfaces of the unsteady-shaped electroconductive powder or the powder having an aspect ratio of 5 or less is preferably in the range of 3–50% by weight, more preferably 3–20% by weight, based on the unsteady-shaped electroconductive powder or the powder having an aspect ratio of 5 or less, in view of cost, electrolytic corrosion inhibitory effect and other factors.

Use of any of said silver-coated conductor powders is desirable because of excellent migration resistance. It is possible to use the silver-coated conductor powder with the coated conductor partly exposed (hereinafter referred to as exposed coated conductor powder).

The exposed coated conductor powder can be used for both of the flake-like conductor powder or the electroconductive powder having an aspect ratio of 6 or greater and the unsteady-shaped electroconductive powder or the electroconductive powder having an aspect ratio of 5 or less.

The exposed area of the electroconductive powder is preferably 50% or less, more preferably 20% or less, for obtaining good electroconductivity.

The spherical silver-coated copper powder or silver-coated copper alloy powder which has been subjected to substitution plating tends to increase in resistance because of limited contact points. It is therefore recommended to give impact to the substitution plated spherical silver-coated copper powder or silver-coated copper alloy powder to change the shape of the powder particles into a flake-like form or a form having an aspect ratio of 6 or greater. Specifically, such change of the powder particle shape can be effected by such a method as ball milling or vibration milling.

As for the blending ratios of the flake-like electroconductive powder and the unsteady-shaped electroconductive powder or the electroconductive powder having an aspect ratio of 6 or greater and the electroconductive powder having an aspect ratio of 5 or less, it is desirable for elevating electroconductivity that the ratio of the unsteady-shaped electroconductive powder or the electroconductive powder having an aspect ratio of 5 or less is in the range of 5–50% by weight to 95–50% by weight of the flake-like electroconductive powder or the electroconductive powder having an aspect ratio of 6 or greater. It is more desirable when the ratio of the unsteady-shaped electroconductive powder or the electroconductive powder having an aspect ratio of 5 or less is in the range of 20–40% by weight to 80–60% by weight of the flake-like electroconductive powder or the electroconductive powder having an aspect ratio of 6 or greater.

The electroconductive paste contains a composite electroconductive powder comprising said types of electroconductive powder, a binder and a solvent. In this electroconductive paste, the content of the composite electroconductive powder is preferably 85–93% by weight, more preferably 87–90% by weight, in view of conductor resistance to the solid matter of the electroconductive paste, economy and adhesion.

As the binder, organic adhesive materials such as liquid epoxy resins, phenol resins, unsaturated polyester resins and the like can be used. As the solvent, terpineol, ethyl carbitol, carbitol acetate, butyl Cellosolve and the like can be used. The electroconductive paste can be obtained by adding, beside said materials, a curing agent of the organic adhesive materials, such as 2-ethylmethylimidazole, and if necessary a corrosion inhibitor such as benzothiazole or benzoimidazole, fine graphite powder, etc., and mixing them uniformly. The contents of the binder and the solvent are preferably in the ranges of 7–15% by weight for the binder and 10–35% by weight for the solvent, more preferably in the ranges of 7–12% by weight for the binder and 15–25% by weight for the solvent, in view of electroconductivity, adhesion and printability. The content of the curing agent is preferably in the range of 0.5–10 parts by weight, more preferably 1–8 parts by weight, per 100 parts by weight of the binder in view of workability. A corrosion inhibitor and fine graphite powder may be added as desired. When they are added, the content of the corrosion inhibitor is preferably in the range of 0.1–is parts by weight per 100 parts by weight of the binder, and the content of the fine graphite powder is preferably in the range of 1–10% by weight based on the electroconductive paste.

The method for forming the electric circuits is not subject to any specific restrictions; the circuits can be formed by known methods, for example, screen printing the electroconductive paste or using a computer-controlled drawing machine.

As the substrate, a polyethylene terephthalate film, a polyimide film, a polyamide-imide film, a paper/phenol laminate, an epoxy/glass laminate, a polyimide/glass substrate and the like can be used.

In the present invention, the resistivity of the electric circuit is preferably 25 $\mu\Omega\cdot$cm or less, more preferably 15 $\mu\Omega\cdot$cm or less. When the resistivity exceeds 25 $\mu\Omega\cdot$cm, electroconductivity tends to lower correspondingly, which may cause an excessive drop of voltage of the electric circuit, making it difficult to form a fine electric circuit. It is especially desirable that the resistivity of the electric circuit be less than 10 $\mu\Omega\cdot$cm, because in this case it is possible to use the fine and long lines such as coiled plane aerial for the electric circuit. For reducing the resistivity of the electric circuit to less than 25 $\mu\Omega\cdot$cm, the circuit pattern formed with said electroconductive paste on the substrate surface is pressed to densify the circuit pattern. For pressing, there can be employed a suitable means, such as applying pressure by using a platen or pressing with the rolls, which is capable elevating the contacting efficiency of the powder particles in the conductive layer formed with said electroconductive paste. It is desirable that the binder in the electroconductive layer is in a softened state when pressing is performed. If the binder is in a half-cured or cured state, it is preferably softened by heating before pressing. The binder may be cured after or during pressing.

EXAMPLES

The examples of the present invention are illustrated below.

Example 1

60 parts by weight of a bisphenol A epoxy resin (trade name Epikote 834, produced by Yuka Shell Epoxy Co., Ltd.) and 40 parts by weight of a bisphenol A epoxy resin (trade name Epikote 828, produced by Yuka Shell Epoxy Co., Ltd.) were dissolved by heating and then cooled to room temperature, after which 5 parts by weight of 2-ethyl-4-methylimidazole (produced by Shikoku Chemicals Corp.), 20 parts by weight of ethyl carbitol and 20 parts by weight of butyl Cellosolve were added and uniformly mixed to prepare a resin composition.

Then 210 parts by weight (79.2% by weight) of a flaky silver powder having an aspect ratio of 8 and an average major particle diameter of 8 $\mu$m (trade name TCG-1, produced by Tokuriki Chemical Research Co., Ltd.) and 55 parts by weight (20.8% by weight) of a silver powder having an aspect ratio of 2.3 and an average major particle diameter of 7 $\mu$m (produced by Rare Metallic Co., Ltd.) (hereinafter referred to as silver powder having an aspect ratio of 2.3) were blended and this blend was added to 145 parts by weight of the previously prepared resin composition and uniformly mixed and dispersed by a mixing and grinding machine and a threeroll mill to obtain an electroconductive paste. The content of the composite silver powder comprising of the flaky reduced silver powder and the silver powder having an aspect ratio of 2.3 was 80% by weight based on the solids of the electroconductive paste.

Then, by using the above electroconductive paste, a silver conductor circuit 1 shown in FIG. 1 was printed on a 125 $\mu$m thick polyethylene terephthalate film and subjected to a heat treatment at 60° C. for 30 minutes and then at 145° C. for 30 minutes in the atmosphere to obtain a wiring board. Reference numeral 2 in FIG. 1 indicates a polyethylene terephthalate film.

The resistivity of the obtained wiring board was measured, finding it was 52 $\mu\Omega$·cm. As a result of a thermal shock test of this wiring board, the rate of change of resistivity was 5%. According to the result of a humidity and DC applied test of this wiring board, the rate of change of resistivity was 8%. The thermal shock test was conducted by carrying out 100 cycles of heating at 125° C. for 30 minutes and cooling at -65° C. for 30 minutes, and the humidity and DC applied test was conducted by maintaining the test piece in the atmosphere of 40° C. and 90% RH for 1,000 hours.

The concrete method of measuring the aspect ratio in the instant Example is shown below. 8 g of the base (No. 20-8130) comprising a low-viscosity epoxy resin (produced by Buehler Ltd.) and 2 g of a curing agent (No. 20-8132) were mixed, in which 2 g of an electroconductive powder was mixed and dispersed well, and the mixture was defoamed in vacuo at 30° C. and then allowed to stand at 30° C. for 6–8 hours, causing the particles to be sedimented and cured. Thereafter, the obtained cured product was cut in the vertical direction, and by magnifying the cut section 2,000 times by an electron microscope, the major diameter/minor diameter ratio of the 100 particles appearing on the cut section was measured, with the average value of the measurements being given as aspect ratio.

Example 2

An electroconductive paste was obtained by following the same process as in Example 1 except that 400 parts by weight (80% by weight) of the flaky silver powder and 100 parts by weight (20% by weight) of the silver powder having an aspect ratio of 2.3 were blended. The content of the composite silver powder comprising the flaky reduced silver powder and the silver powder having an aspect ratio of 2.3 was 85% by weight based on the solids of the electroconductive paste. Thereafter the same procedure as in Example 1 was followed to make a wiring board and its characteristics were evaluated. As a result, resistivity of the wiring board was 43 $\mu\Omega$·cm. Also, as a result of the thermal shock test of this wiring board, the rate of change of resistivity was 4%. The result of the humidity and DC applied test showed the rate of change of resistivity was 7%.

Example 3

An electroconductive paste was obtained by following the same process as in Example 1 except that 320 parts by weight (80% by weight) of flaky silver powder and 80 parts by weight (20% by weight) of silver powder having an aspect ratio of 2.3 were blended. The content of the composite silver powder comprising the flaky reduced silver powder and the silver powder having an aspect ratio of 2.3 was 86% by weight. A wiring board was manufactured by following the same procedure as in Example 1, and its characteristics were evaluated. As a result, resistivity of the wiring board was 39 $\mu\Omega$·cm. The result of the thermal shock test of said wiring board showed that the rate of change of resistivity was 5%. According to the result of the humidity and DC applied test, the rate of change of resistivity was 6%.

Example 4

The wiring board obtained in Example 3 was hot pressed under the conditions of 100° C. and 10 MPa to densify the silver conductor circuit, and its characteristics were evaluated. As a result, resistivity of the densified wiring board was 22 $\mu\Omega$·cm. The result of the thermal shock test of the densified wiring board showed that the rate of change of resistivity was 5%. According to the result of the humidity and DC applied test, the rate of change of resistivity was 4%.

Comparative Example 1

400 parts by weight of the flaky reduced silver powder used in Example 1 was added to 145 parts by weight of the resin composition obtained in Example 1 and uniformly mixed and dispersed in the same way as in Example 1 to obtain an electroconductive paste. Thereafter a wiring board was manufactured by following the same process as in Example 1, and its characteristics were evaluated. As a result, resistivity of the wiring board was 62 $\mu\Omega$·cm. As a result of the thermal shock test of said wiring board, the rate of change of resistivity was 10%. The result of the humidity and DC applied test showed that the rate of change of resistivity was 9%.

Comparative Example 2

A wiring board was obtained by following the same process as in Example 1 except for use of the electroconductive paste obtained in Comparative Example 1. Then said wiring board was hot pressed under the same conditions as in Example 4 to density the silver conductor circuits, and its characteristics were evaluated. As a result, resistivity of the densified wiring board was 58 $\mu\Omega$·cm. As a result of the thermal shock test of the densified wiring board, the rate of change of resistivity was 10%. According to the result of the humidity and DC applied test, the rate of change of resistivity was 9%.

Example 5

An Ni powder having an aspect ratio of 2 and an average major particle diameter of 3 μm (produced by High Purity Chemicals Co., Ltd.) was degreased by an acidic cleaner (trade name L-5B, produced by Nippon Macdermid Co., Ltd.), washed with water, subjected to electroless plating in a mixed bath of 20 g AgCN/l liter $H_2O$ and 40 g NaCN/l litre $H_2O$ so that the amount of silver became 15% by weight based on said Ni powder, then washed with water and dried to obtain a silver-coated Ni powder.

Then 210 parts by weight (91.3% by weight) of a flaky silver powder having an aspect ratio of 8 and an average major particle diameter of 8 μm (trade name TCG-1 produced by Tokuriki Chemical Research Co., Ltd.) and 20 parts by weight (8.7% by weight) of the above silver-coated Ni powder were blended, and the blend was added to 145 parts by weight of the resin composition obtained in Example 1 and uniformly mixed and dispersed by a mixing and grinding machine and a three-roll mill to obtain an electroconductive paste. The content of the composite electroconductive powder comprising the flaky silver powder and the silver-coated Ni powder was 61.3% by weight based on the solids of the electroconductive paste.

A wiring board was manufactured by following the same procedure as in Example 1 and its characteristics were evaluated. As a result, resistivity of the wiring board was 43 μΩ·cm. As a result of the thermal shock test of the wiring board, the rate of change of resistivity was 5%. The result of the humidity and DC applied test gave 8% as the rate of change of resistivity.

Example 6

An electroconductive paste was obtained by following the same process as in Example 5 except that 400 parts by weight (88.9% by weight) of the flaky silver powder used in Example 5 and 50 parts by weight (11.1% by weight) of the silver-coated Ni powder obtained in Example 5 were blended. The content of the composite electroconductive powder comprising the flaky silver powder and the silver-coated Ni powder was 70.7% by weight based on the solids of the electroconductive paste. A wiring board was made by following the same process as in Example 5 and its characteristics were evaluated. As a result, resistivity of the wiring board was 43 μΩ·cm. As a result of the thermal shock test of said wiring board, the rate of change of resistivity was 4%. According to the result of the humidity and DC applied test, the rate of change of resistivity was 7%.

Example 7

An electroconductive paste was obtained by following the same process as in Example 5 except that 320 parts by weight (91.4% by weight) of the flaky silver powder used in Example 5 and 30 parts by weight (8.6% by weight) of the silver-coated Ni powder obtained in Example 5 were blended. The content of the composite electroconductive powder comprising the flaky silver powder and the silver-coated Ni powder was 70.7% by weight based on the solids of the electroconductive paste. A wiring board was manufactured by the following the same process as in Example 5 and its characteristics were evaluated. As a result, resistivity of the wiring board was 38 μΩ·cm. As a result of the thermal shock test of said wiring board, the rate of change of resistivity was 5%. According to the result of the humidity and DC applied test, the rate of change of resistivity was 6%.

Example 8

An electroconductive paste was obtained by following the same process as in Example 5 except that 320 parts by weight (80.0% by weight) of the flaky silver powder used in Example 5 and 80 parts by weight (20.0% by weight) of the silver-coated Ni powder were blended. The content of the composite electroconductive powder comprising the flaky silver powder and the silver-coated Ni powder was 89.9% by weight based on the solids of the electroconductive paste. Then said wiring board was hot pressed under the conditions of 100° C. and 10 MPa to densify the printed circuit, and its characteristics were evaluated. As a result, resistivity of the densified wiring board was 20 μΩ·cm. As a result of the thermal shock test of the densified wiring board, the rate of change of resistivity was 5%. According to the result of the humidity and DC applied test, the rate of change of resistivity was 4%.

Example 9

400 parts by weight (66.7% by weight) of a flaky silver powder B having an aspect ratio of 11 and an average major diameter of 20 μm, obtained by grinding a silver powder A having an aspect ratio of 8 and an average major particle diameter of 8 μm (trade name TCG-1 produced by Tokuriki Chemical Research Co., Ltd.) by a mixing and grinding machine (mfd. by Mitsui Mining Co., Ltd.), and 200 parts by weight (33.3% by weight) of a silver powder having an aspect ratio of 2.3 and an average particle diameter of 7 μm (produced by Rare Metallic Co., Ltd.) were blended, and this blend was added to 145 parts by weight of the resin composition obtained in Example 1, and uniformly mixed and dispersed by a mixing and grinding machine and a three-roll mill to obtain an electroconductive paste. The ratio of the flaky silver powder B to the silver powder having an aspect ratio of 2.3 was 6.67:3.33 by volume. The composite electroconductive (silver) powder was contained in an amount of 85.1% based on the solids of the electroconductive paste.

Figure 2:
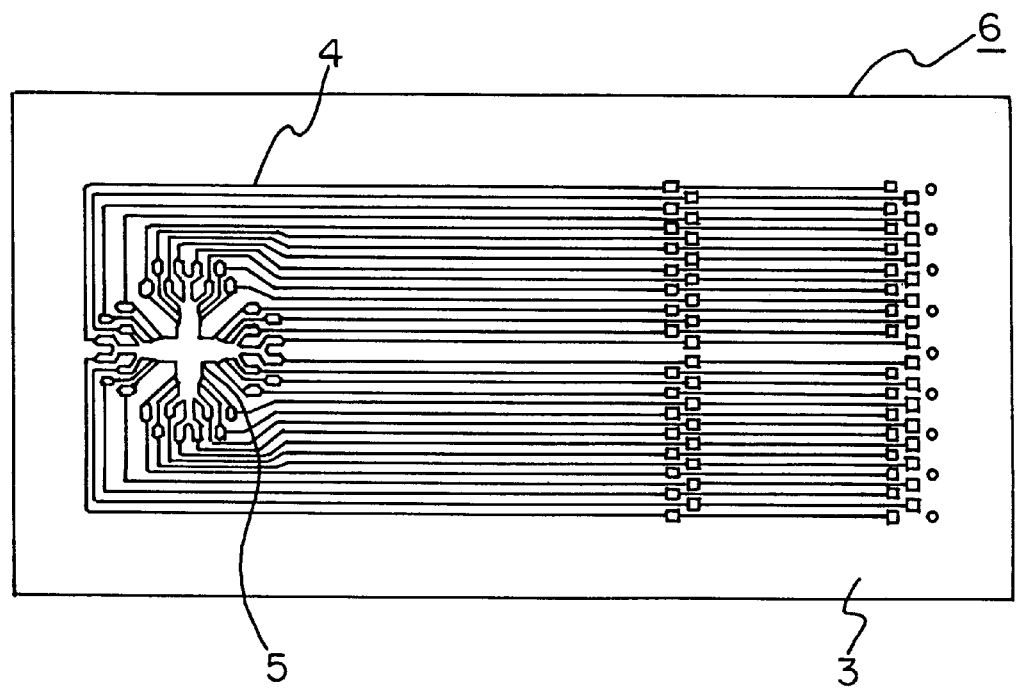
FIG. 2 is a plane view of a circuit board in an embodiment of the present invention. Reference numeral 3 indicates a substrate, 4 a circuit, 5 a chipmounting portion, and 6 a circuit board.
Figure 3:
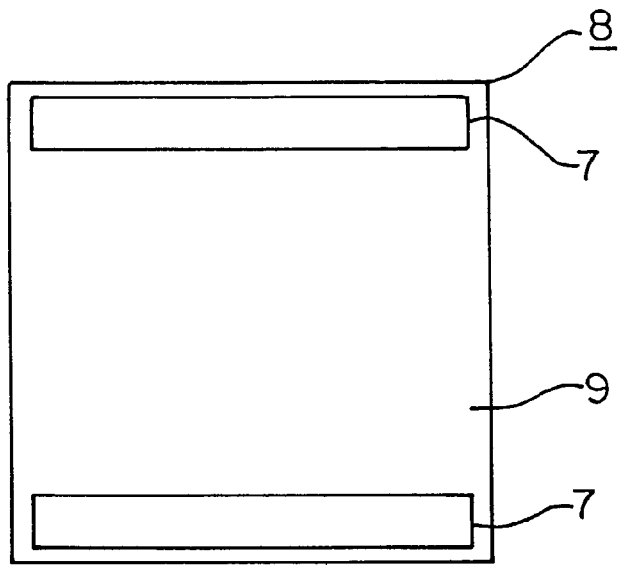
FIG. 3 is a plane view of an IC chip. Reference numeral 7 indicates a test circuit, 8 an IC chip, and 9 a silicon substrate.
Figure 4:
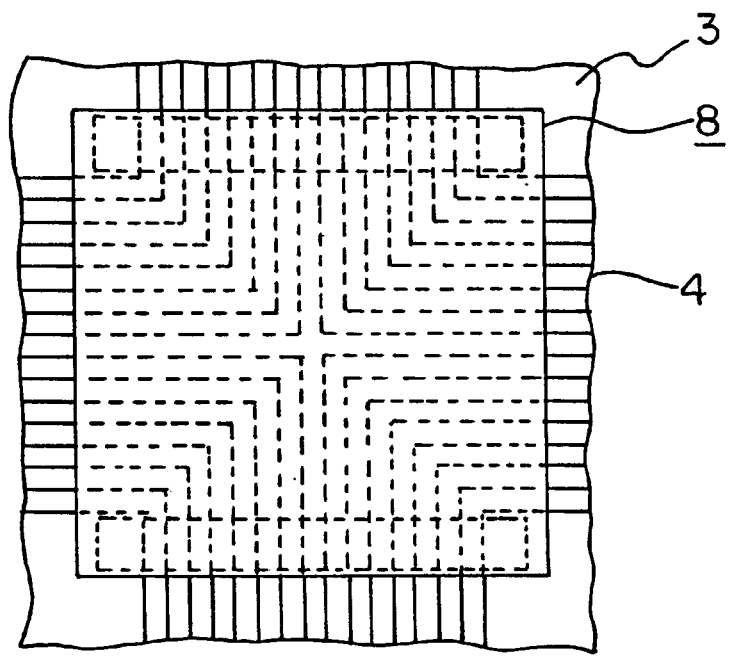
FIG. 4 is a schematic illustration showing a state where an IC chip has been mounted on a chipmounting portion of a circuit board.

The above electroconductive paste was printed to a test pattern shown in FIG. 2 and cured by heating to form a 25 μm thick circuit 4 to obtain a circuit board 6. A polyethylene terephthalate film (125 μm thick) was used as the substrate 3, and curing by heating was conducted under the conditions of 60° C./30 minutes and 145° C./45 minutes. Resistivity of the obtained circuit board 6 was 42 μΩ·cm. As a result of the thermal shock test of said circuit board 6, the rate of change of resistivity was 5%. According to the result of the humidity and DC applied test, the rate of change of resistivity was 8%. The thermal shock test was conducted by carrying out 100 cycles of heating at 125° C. for 30 minutes and cooling at −65° C. for 30 minutes, and the humidity and DC applied test was conducted by keeping the test piece in the atmosphere of 40° C. and 90% RH for 1,000 hours. On the other hand, an IC chip 8 made by forming a test circuit 7 on a silicon substrate 9 shown in FIG. is was placed on the upper side of the chip mounting portion of said circuit board 6 via an anisotropic conductive sheet (trade name Anisorum 8201, produced by Hitachi Chemical Co., Ltd.) (not shown) so that the test circuit 7 came on the underside as shown in FIG. 4 and connected. The average value of connecting resistance including the anisotropic electroconductive sheet was 45 mΩ, the maximum value thereof being 63 mΩ.

Example 10

A blend of 350 parts by weight (50% by weight) of the flaky silver powder B used in Example 9 and 350 parts by weight (50% by weight) of the silver powder having an aspect ratio of 2.3 was added to 145 parts by weight of the resin composition obtained in Example 1 and uniformly mixed and dispersed in the same way as in Example 9 to obtain an electroconductive paste. The ratio of the flaky silver powder B to the silver powder having an aspect ratio of 2.3 was 5:5 by volume. The composite electroconductive (silver) powder was contained in an amount of 43.2% by volume (86.9% by weight) based on the solids of the electroconductive paste. A circuit board was made by following the same process as in Example 9 and its characteristics were evaluated. As a result, resistivity was 41 $\mu\Omega$·cm. As a result of the thermal shock test of said circuit board, the rate of change of resistivity was 4%. According to the result of the humidity and DC applied test, the rate of change of resistivity was 7%. When a test circuit was connected by using an anisotropic electroconductive sheet in the same way as in Example 9, the average value of connecting resistance was 40 m$\Omega$, the maximum value thereof being 55 m$\Omega$.

Example 11

A blend of 650 parts by weight (72.2% by weight) of the flaky silver powder used in Example 9 and 250 parts by weight (27.8% by weight) of the silver powder having an aspect ratio of 2.3 was added to 145 parts by weight of the resin composition obtained in Example 1, and uniformly mixed and dispersed in the same way as in Example 9 to obtain an electroconductive paste. The ratio of the flaky silver powder B to the silver powder having an aspect ratio of 2.3 was 7.22:2.78 by volume. The composite electroconductive (silver) powder was contained in an amount of 49.5% by volume (89.6% by weight) based on the solids of the electroconductive paste. A circuit board was made by following the same process as in Example 9, and its characteristics were evaluated. As a result, resistivity was 39 $\mu\Omega$·cm. As a result of the thermal shock test of said circuit board, the rate of change of resistivity was 5%. According to the result of the humidity and DC applied test, the rate of change of resistivity was 6%. The average value of connecting resistance measured after connecting a test circuit by using an anisotropic electroconductive sheet in the same way as in Example 9 was 38 m$\Omega$, the maximum value thereof being 58 m$\Omega$.

Example 12

A blend of 700 parts by weight (58.3% by weight) of the flaky silver powder B used in Example 9 and 500 parts by weight (41.7% by weight) of the silver powder having an aspect ratio of 2.3 was added to 145 parts by weight of the resin composition used in Example 1 and uniformly mixed and dispersed in the same way as in Example 9 to obtain an electroconductive paste. The ratio of the flaky silver powder B to the silver powder having an aspect ratio of 2.3 was 5.83:4.17 by volume. The composite electroconductive (silver) powder was contained in an amount of 56.6% by volume (91.9% by weight) based on the solids of the electroconductive paste. A circuit board was made by following the same process as in Example 9 except that heat curing was conducted under the conditions of 60° C./30 minutes and 110° C./one hour. Then the circuit board was hot pressed under the conditions of 100° C. and 9.8 MPa to densify the circuit, and the characteristics of the board were evaluated. As a result, resistivity (of the circuit board) was 9.1 $\mu\Omega$·cm. As a result of the thermal shock test of said circuit board, the rate of change of resistivity was 5%. According to the result of the humidity and DC applied test, the rate of change of resistivity was 4%. The average value of connecting resistance measured after connecting the circuit by using an anisotropic conductive sheet in the same way as in Example 9 was 32 m$\Omega$, the maximum value being 42 m$\Omega$.

Comparative Example 3

600 parts by weight of the flaky silver powder B used in Example 9 was added to 145 parts by weight of the resin composition obtained in Example 1, and then uniformly mixed and dispersed in the same way as in Example 9 to obtain an electroconductive paste. A circuit board was made by following the same process as in Example 9 and its characteristics were evaluated. As a result, resistivity (of the circuit board) was 46 $\mu\Omega$·cm. The result of the thermal shock test of said circuit board showed that the rate of change of resistivity was 10%. According to the result of the humidity and DC applied test, the rate of change of resistivity was 9%. The average value of connecting resistance measured after connecting the circuit by using an anisotropic conductive sheet as in Example 9 was 1.05 m$\Omega$, the maximum value being 12 ma.

Example 13

A blend of 380 parts by weight (63.3% by weight) of the flaky silver powder B used in Example 9 and 220 parts by weight (36.7% by weight) of the silver powder having an aspect ratio of 2.3 was added to 145 parts by weight of the resin composition obtained in Example 1, and uniformly mixed and dispersed in the same way as in Example 9 to obtain an electroconductive paste. The ratio of the flaky silver powder B to the silver powder having an aspect ratio of 2.3 was 6.33:3.67 by volume. The composite electroconductive (silver) powder was contained in an amount of 39.5% by volume (85.1% by weight) based on the solids of the electroconductive paste. A circuit board was made by following the same process as in Example 9, and its characteristics were evaluated. As a result, resistivity (of the circuit board) was 43 $\mu\Omega$·cm. As a result of the thermal shock test of said circuit board, the rate of change of resistivity was 5%. The result of the humidity and DC applied gave 8% as the rate of change of resistivity. The average value of connecting resistance measured after connecting the test circuit by using an anisotropic electroconductive sheet in the same way as in Example 9 was 42 m$\Omega$, the maximum value being 60 m$\Omega$.

Example 14

A blend of 380 parts by weight (54.2% by weight) of the flaky silver powder B used in Example 9 and 320 parts by weight (45.8% by weight) of the silver powder having an aspect ratio of 2.3 was added to 145 parts by weight of the resin composition obtained in Example 1, and uniformly mixed and dispersed in the same way as in Example 9 to obtain an electroconductive paste. The ratio of the flaky silver powder B to the silver powder having an aspect ratio of 2.3 was 5.42:4.58 by volume. The composite electroconductive (silver) powder was contained in an amount of 43.2% by volume (86.9% by weight) based on the solids of the electroconductive paste. A circuit board was made by following the same process as in Example 9, and its characteristics were evaluated. As a result, resistivity (of the circuit board) was 43 $\mu\Omega$·cm. As a result of the thermal shock test of said circuit board, the rate of change of resistivity was 4%. According to the result of the humidity and DC applied test, the rate of change of resistivity was 7%. The average value of connecting resistance measured after connecting the test circuit by using an anisotropic electroconductive sheet in the same way as in Example 9 was 38 mΩ, the maximum value being 52 mΩ.

Example 15

A blend of 600 parts by weight (66.7% by weight) of the flaky silver powder B used in Example 9 and 300 parts by weight (33.3% by weight) of the silver powder having an aspect ratio of 2.3 was added to 145 parts by weight of the resin composition obtained in Example 1, and uniformly mixed and dispersed in the same way as in Example 9 to obtain an electroconductive paste. The ratio of the flaky silver powder B to the silver powder having an aspect ratio of 2.3 was 6.67:3.33 by volume. The composite electroconductive (silver) powder was contained in an amount of 49.5% by volume (89.6% by weight) based on the solids of the electroconductive paste. A circuit board was made by following the same process as in Example 9, and its characteristics were evaluated. As a result, resistivity (of the circuit board) was 35 $\mu\Omega$·cm. As a result of the thermal shock test of said circuit board, the rate of change of resistivity was 5%. According to the result of the humidity and DC applied test, the rate of change of resistivity was 6%. The average value of connecting resistance measured after connecting the test circuit by using an anisotropic electroconductive sheet in the same way as in Example 9 was 36 mΩ, the maximum value being 56 mΩ.

Example 16

A blend of 650 parts by weight (54.2% by weight) of the flaky silver powder B used in Example 9 and 550 parts by weight (45.8% by weight) of the silver powder having an aspect ratio of 2.3 was added to 145 parts by weight of the resin composition used in Example 1, and uniformly mixed and dispersed in the same way as in Example 9 to obtain an electroconductive paste. The ratio of the flaky silver powder B to the silver powder having an aspect ratio of 2.3 was 5.42:4.58 by volume. The composite electroconductive (silver) powder was contained in an amount of 56.6% by volume (91.9% by weight) based on the solids of the electroconductive paste. A circuit board was made by following the same process as in Example 9 and hot pressed under the conditions of 100° C. and 9.8 MPa to densify the circuits, and its characteristics were evaluated. As a result, resistivity (of the circuit board) was 8.7 $\mu\Omega$·cm. As a result of the thermal shock test of said circuit board, the rate of change of resistivity was 5%. According to the result of the humidity and DC applied test, the rate of change of resistivity was 4%. The average value of connecting resistance measured after connecting the circuit by using an anisotropic electroconductive sheet in the same way as in Example 9 was 30 mΩ, the maximum value being 40 mΩ.

Example 17

A blend of 450 parts by weight (75% by weight) of the flaky silver powder having as aspect ratio of 8 and an average major particle diameter of 8 $\mu$m (trade name TCG-1 produced by Tokuriki Chemical Research Co., Ltd.) and 150 parts by weight (25% by weight) of the silver powder having an aspect ratio of 2.3 and an average major particle diameter of 7 $\mu$m (produced by Rare Metallic Co., Ltd.) (hereinafter referred to as silver powder having an aspect ratio of 2.3) was added to 145 parts by weight of the resin composition obtained in Example 1 and uniformly mixed and dispersed by a mixing and grinding machine and a three-roll mill to obtain an electroconductive paste. The content of the flaky silver powder and the silver powder having an aspect ratio of 2.3 was 39.5% by volume (85.1% by weight) based on the solids of the electroconductive paste.

A wiring board was manufactured by following the same process as in Example 1, and this wiring board was hot pressed under the conditions of 110° C. and 10 MPa for 2 minutes and then cured at 145° C. for 30 minutes to form an electric circuit with a densified circuit pattern. Resistivity of this electric circuit was 13 $\mu\Omega$·cm. As a result of the thermal shock test of said wiring board, the rate of change of resistivity was 5%. According to the result of the humidity and DC applied test of said wiring board, the rate of change of resistivity was 7%. The thermal shock test was conducted by carrying out 100 cycles of heating at 125° C. for 30 minutes and cooling at −65° C. for 30 minutes, and the humidity and DC applied test was conducted by maintaining the test piece in an atmosphere of 40° C. and 90% RH for 1,000 hours.

Example 18

An electroconductive paste was obtained by following the same process as in Example 17 except that 550 parts by weight (84.6% by weight) of the flaky silver powder used in Example 17 and 100 parts by weight (15.4% by weight) of the silver powder having an aspect ratio of 2.3 were blended. The content of the flaky silver powder and the silver powder having an aspect ratio of 2.3 was 41.4% by volume (86.1% by weight) based on the solids of the electroconductive paste. A wiring board was made by following the same process as in Example 17, then an electric circuit was formed thereon, and its characteristics were evaluated. As a result, resistivity of the electric circuit was 10 $\mu\Omega$·cm. As a result of the thermal shock test of said wiring board, the rate of change of resistivity was 4%. The result of the humidity and DC applied test showed 7% as the rate of change of resistivity.

Example 19

An electroconductive paste was obtained by following the same process as in Example 17 except that 900 parts by weight (81.8% by weight) of the flaky silver powder used in Example 17 and 200 parts by weight (18.2% by weight) of the silver powder having an aspect ratio of 2.3 were blended. The content of the flaky silver powder and the silver powder having an aspect ratio of 2.3 was 55% by volume (91.5% by weight) based on the solids of the electroconductive paste. A wiring board was made by following the same process as in Example 17, then an electric circuit was formed thereon, and its characteristics were evaluated. As a result, resistivity of the electric circuit was 8.2 $\mu\Omega$·cm. As a result of the thermal shock test of said wiring board, the rate of change of resistivity was 5%. According to the result of the humidity and DC applied test, the rate of change of resistivity was 6%.

Example 20

The wiring board obtained in Example 19 was hot pressed by heated rolls under the conditions of 125° C. and 980 N/cm at a rate of 30 cm/min and cured at 145° C. for 30 minutes to form an electric circuit with a densified circuit pattern. Resistivity of this electric circuit was 8.3 $\mu\Omega$·cm. As a result of the thermal shock test of said wiring board, the rate of change of resistivity was 5%. According to the result of the humidity and DC applied test, the rate of change of resistivity was 4%.

Example 21

An electroconductive paste was obtained by following the same process as in Example 17 except that 410 parts by weight (66.7% by weight) of the flaky silver powder used in Example 17 and 205 parts by weight (33.3% by weight) of the silver powder having an aspect ratio of 2.3 were blended. The content of the flaky silver powder and the silver powder having an aspect ratio of 2.3 was 40% by volume (85.4% by weight) based on the solids of the electroconductive paste. A wiring board was obtained by following the same process as in Example 17.

Then the above wiring board was hot pressed under the conditions of 100° C. and 5 MPa for 2 minutes and then cured at 145° C. for 30 minutes to form an electric circuit with a densified circuit pattern. Resistivity of this electric circuit was 12 $\mu\Omega$·cm. As a result of the thermal shock test of said wiring board, the rate of change of resistivity was 5%. According to the result of the humidity and DC applied test, the rate of change of resistivity was 8%. The thermal shock test was conducted by carrying out 100 cycles of heating at 125° C. for 30 minutes and cooling at −65° C. for 30 minutes, and the humidity and DC applied test was conducted by maintaining the test piece in an atmosphere of 40° C. and 90% RH for 1,000 hours.

Example 22

An electroconductive paste was obtained by following the same process as in Example 17 except that 600 parts by weight (80% by weight) of the flaky silver powder used in Example 17 and 150 parts by weight (20% by weight) of the silver powder having an aspect ratio of 2.3 were blended. The content of the flaky silver powder and the silver powder having an aspect ratio of 2.3 was 45% by volume (87.7% by weight) based on the solids of the electroconductive paste. A wiring board was made by following the same process as in Example 17, then an electric circuit was formed by following the same process as in Example 21 and its characteristics were evaluated. As a result, resistivity of the electric circuit was 10 $\mu\Omega$·cm. As a result of the thermal shock test of said wiring board, the rate of change of resistivity was 4%. According to the result of the humidity and DC applied test, the rate of change of resistivity was 7%.

Example 23

An electroconductive paste was obtained by following the same process as in Example 17 except that 800 parts by weight (72.7% by weight) of the flaky silver powder used in Example 17 and 300 parts by weight (27.3% by weight) of the unsteady-shaped silver powder were blended. The content of the composite silver powder comprising the flaky silver powder and the silver powder having an aspect ratio of 2.3 was 54.5% by volume (91.3% by weight) based on the solids of the electroconductive paste. A wiring board was manufactured by following the same process as in Example 17, then an electric circuit was formed thereon and its characteristics were evaluated. As a result, resistivity of the electric circuit was 8.5 $\mu\Omega$·cm. As a result of the thermal shock test of said wiring board, the rate of change of resistivity was 5%. According to the result of the humidity and DC applied test, the rate of change of resistivity was 6%.

Example 24

The wiring board obtained in Example 23 was hot pressed by heated rolls under the conditions of 125° C. and 980 N/cm at a rate of 30 cm/min and then cured at 145° C. for 30 minutes to form an electric circuit with a densified circuit pattern. Resistivity of this electric circuit was 8.4 $\mu\Omega$·cm. As a result of the thermal shock test of said wiring board, the rate of change of resistivity was 5%. According to the result of the humidity and DC applied test, the rate of change of resistivity was 4%.

Example 25

550 parts by weight (84.6% by weight) of the flaky silver powder used in Example 17 and 100 parts by weight (15.4% by weight) of the Ni powder having an aspect ratio of 3 and an average particle diameter of 5 $\mu$m were blended, and this blend was added to 145 parts by weight of the resin composition obtained in Example 1 and uniformly mixed and dispersed by a mixing and grinding machine and a three-roll mill to obtain an electroconductive paste. The content of the flaky silver powder and the Ni powder was 42.5% by volume (86.6% by weight) based on the solids of the electroconductive paste. A wiring board was obtained by following the same process as in Example 17.

Then the above wiring board was hot pressed under the conditions of 110° C. and 10 MPa for 2 minutes and then cured at 145° C. for 30 minutes to form an electric circuit with a densified circuit pattern. Resistivity of this electric circuit was 12 $\mu\Omega$·cm. As a result of the thermal shock test, the rate of change of resistivity was 7%. The result of the humidity and DC applied test of said wiring board gave 6% as the rate of change of resistivity. The thermal shock test was conducted by carrying out 100 cycles of heating at 125° C. for 30 minutes and cooling at −65° C. for 30 minutes, and the humidity and DC applied test was conducted by keeping the test piece in an atmosphere of 40° C. and 90% RH for 1,000 hours.

Example 26

An electroconductive paste was obtained by following the same process as in Example 17 except that 650 parts by weight (86.7% by weight) of the flaky silver powder used in Example 17 and 100 parts by weight (13.3% by weight) of the Ni powder were blended. The content of the flaky silver powder and the Ni powder was 45.5% by volume (88% by weight) based on the solids of the electroconductive paste. A wiring board was made by following the same process as in Example 17, then an electric circuit was formed thereon by following the same process as in Example 25, and its characteristics were evaluated. As a result, resistivity of the electric circuit was 10 $\mu\Omega$·cm. As a result of the thermal shock test of said wiring board, the rate of change of resistivity was 4%. According to the result of the humidity and DC applied test, the rate of change of resistivity was 5%.

Example 27

An electroconductive paste was obtained by following the same process as in Example 17 except that 900 parts by weight (87.4% by weight) of the flaky silver powder used in Example 17 and 130 parts by weight (12.6% by weight) of the Ni powder were blended. The content of the flaky silver powder and the Ni powder was 53.5% by volume (91% by weight) based on the solids of the electroconductive paste. A wiring board was made by following the same process as in Example 17, then an electric circuit was formed thereon by following the same process as in Example 25, and its characteristics were evaluated. As a result, resistivity of the electric circuit was 8.2 $\mu\Omega$·cm. As a result of the thermal shock test of said wiring board, the rate of change of resistivity was 5%. According to the result of the humidity and DC applied test, the rate of change of resistivity was 5%.

Example 28

The wiring board obtained in Example 27 was hot pressed by heated rolls under the conditions of 125° C. and 980

N/cm at a rate of 30 cm/min, and then cured at 145° C. for 30 minutes to form an electric circuit with a densified circuit pattern. Resistivity of this electric circuit was 8.5 $\mu\Omega$·cm. As a result of the thermal shock test of said wiring board, the rate of change of resistivity was 5%. According to the result of the humidity and DC applied test, the rate of change of resistivity was 5%.

Example 29

An electroconductive paste was obtained by following the same process as in Example 17 except that 410 parts by weight (66.7% by weight) of the flaky silver powder used in Example 17 and 205 parts by weight (33.3% by weight) of the Ni powder were blended. The content of the flaky silver powder and the Ni powder was 41.5% by volume (86.1% by weight) based on the solids of the electroconductive paste. A wiring board was obtained by following the same process as in Example 17.

Then the above wiring board was hot pressed under the conditions of 100° C. and 5 MPa for 2 minutes and then cured at 145° C. for 30 minutes to form an electric circuit having a densified circuit pattern. Resistivity of this electric circuit was 12.5 $\mu\Omega$·cm. As a result of the thermal shock test of said wiring board, the rate of change of resistivity was 5%. According to the result of the humidity and DC applied test, the rate of change of resistivity was 6%. The thermal shock test was conducted by carrying out 100 cycles of heating at 125° C. for 30 minutes and cooling at −65° C. for 30 minutes, and the humidity and DC applied test was conducted by keeping the test piece in an atmosphere of 40° C. and 90% RH for 1,000 hours.

Example 30

An electroconductive paste was obtained by following the same process as in Example 17 except that 700 parts by weight (87.5% by weight) of the flaky silver powder used in Example 17 and 100 parts by weight (12.5% by weight) of the Ni powder were blended. The content of the flaky silver powder and the Ni powder was 54.0% by volume (91.1% by weight) based on the solids of the electroconductive paste. A wiring board was made by following the same process as in Example 17, then an electric circuit was formed thereon in the same way as in Example 29 and its characteristics were evaluated. As a result, resistivity of the electric circuit was 9.5 $\mu\Omega$·cm. As a result of the thermal shock test of said wiring board, the rate of change of resistivity was 4%. According to the result of the humidity and DC applied test, the rate of change of resistivity was 5%.

Example 31

An electroconductive paste was obtained by following the same process as in Example 17 except that 750 parts by weight (83.3% by weight) of the flaky silver powder used in Example 17 and 150 parts by weight (16.7% by weight) of the 10 wt % silver plated Ni powder were blended. The content of the composite silver powder comprising the flaky silver powder and the silver-plated Ni powder was 50.0% by volume (89.7% by weight) based on the solids of the electroconductive paste. A wiring board was made by following the same process as in Example 17, then an electric circuit was formed thereon by following the same process as in Example 29, and its characteristics were evaluated. As a result, resistivity of the electric circuit was 8.3 $\mu\Omega$·cm. As a result of the thermal shock test of said wiring board, the rate of change of resistivity was 5%. According to the result of the humidity and DC applied test, the rate of change of resistivity was 4%.

Example 32

The wiring board obtained in Example 31 was hot pressed by heated rollers under the conditions of 125° C. and 980 N/cm at a rate of 30 cm/min and then cured at 145° C. for 30 minutes to form an electric circuit having a densified circuit pattern. Resistivity of this electric circuit was 8.4 $\mu\Omega$·cm. As a result of the thermal shock test of said wiring board, the rate of change of resistivity was 4%. According to the result of the humidity and DC applied test, the rate of change of resistivity was 4%.

Example 33

A spherical copper powder (SF-Cu produced by Nippon Atomized Metal Powders Corp.) was coated by 25% by weight with silver by a substitution plating method, and then rolled with zirconia balls in a ball mill at a rate of 60 revolutions per minute for 30 minutes to change the shape, thereby obtaining a flaky silver-coated copper powder having an average major particle diameter of 10.3 $\mu$m, an aspect ratio of 6 and a copper exposed area of 3–18%, 7% on the average. Separately from the above, the same type of copper powder as described above was coated by 25% by weight with silver by a substitution plating method, and then rolled with glass balls in a ball mill at a rate of 60 revolutions per minute for 20 minutes to change the shape, thereby obtaining an unsteady-shaped silver-coated copper powder having an average major particle diameter of 7.5 $\mu$m, an aspect ratio of 2 and a copper exposed area of 2–7%, 3% on the average. Next, 410 parts by weight (66.7% by weight) of the flaky silver-coated copper powder and 205 parts by weight (33.3% by weight) of the unsteady-shaped silver-coated copper powder were added to 145 parts by weight of the resin composition obtained in Example 1 and uniformly mixed and dispersed by a mixing and grinding machine and a three-roll mill to obtain an electroconductive paste. The content of the flaky silver-coated copper powder and the unsteady-shaped silver-coated copper powder was 86% by weight based on the solids of the electroconductive paste.

The copper exposed area was determined in the following way. An SEM photograph of the silver-coated copper powder was taken by a scanning electron microscope (SEM) and 20 particles of the silver-coated copper powder were picked up randomly therefrom and subjected to an areal analysis of the silver and copper particles by an X-ray analyzer, calculating the rate of copper exposure from the areal rates of the portion coated with silver and the portion where copper was exposed. The average of the determinations was shown here as the copper exposed area. The copper exposed area was determined in the same way in the following Examples and Comparative Examples.

Figure 5:
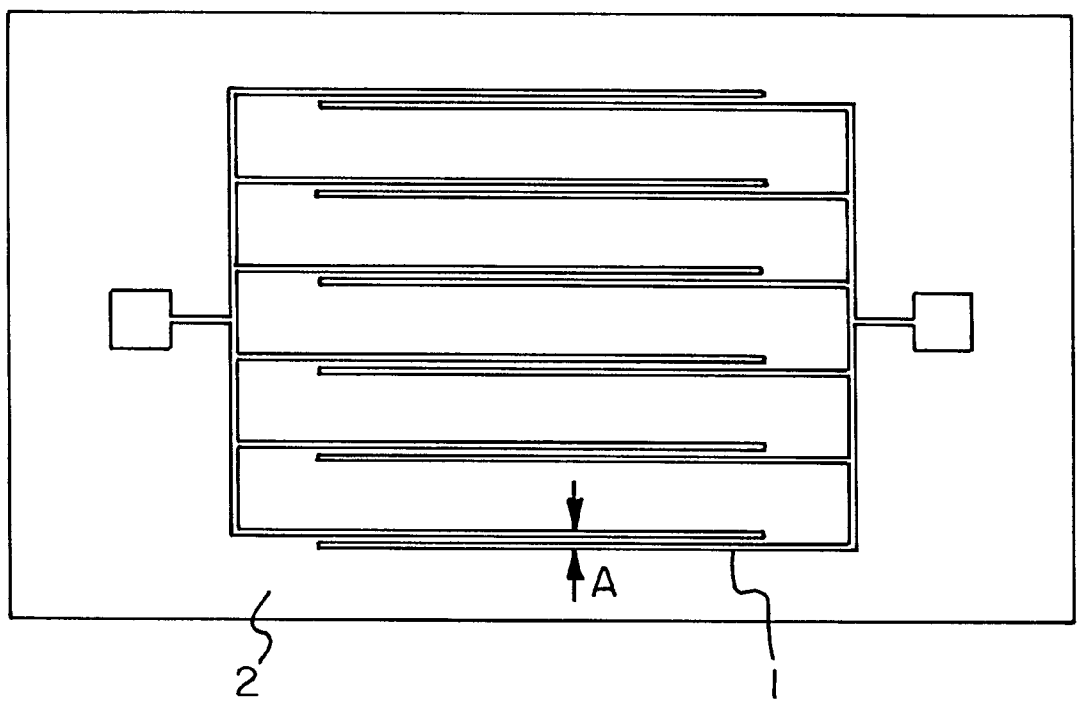
FIG. 5 is a plane view showing a state where a silver electroconductive circuit has been printed in the pattern of a comb on a polyethylene terephthalate film.

Thereafter, by using the above electroconductive paste, a silver conductor circuit 1 shown in FIG. 1 and FIG. 5 was printed on a 125 $\mu$m thick polyethylene terephthalate film, then hot pressed at 80° C. in the atmosphere for 30 minutes and further at 100° C. under a pressure of 5 MPa for 2 minutes, and then heat treated at 145° C. for 30 minutes to obtain an electric circuit. The size of A in FIG. 5 was 100 $\mu$m.

Resistivity of the obtained electric circuit shown in FIG. 1 was 11.5 $\mu\Omega$·cm. As a result of the thermal shock test of the electric circuit, the rate of change of resistivity was 5%. As a result of the humidity and DC applied test of the interdigital electric circuit shown in FIG. 5, the insulation resistance was $10^8$ $\Omega$ or more. The thermal shock test was conducted by carrying out 100 cycles of heating at 125° C. for 30 minutes and cooling at −65° C. for 30 minutes, and the humidity and DC applied test was conducted by applying a voltage of 50 V across the adjoining lines and keeping the test piece in an atmosphere of 40° C. and 90% RH for 2,000 hours.

Example 34

700 parts by weight (87.5% by weight) of the flaky silver-coated copper powder obtained in Example 33 and 100 parts by weight (12.5% by weight) of the unsteady-shaped silver-coated copper powder obtained in Example 33 were added to 145 parts by weight of the resin composition obtained in Example 1 and uniformly mixed and dispersed by a mixing and grinding machine and a three-roll mill to obtain an electroconductive paste. The content of the flaky silver-coated copper powder and the unsteady-shaped silver-coated copper powder was 89% by weight based on the solids of the electroconductive paste. An electric circuit was made by following the same process as in Example 33 and its characteristics were evaluated. As a result, resistivity of the electric circuit was 9.5 $\mu\Omega$·cm. As a result of the thermal shock test of the electric circuit, the rate of change of resistivity was 4%. In the humidity and DC applied test of the interdigital electric circuit, the insulation resistance was $10^8$ $\Omega$ or more.

Example 35

750 parts by weight (83.3% by weight) of the flaky silver-coated copper powder obtained in Example 33 and 150 parts by weight (16.7% by weight) of an unsteady-shaped silver-coated copper powder having an average major particle diameter of 6.0 $\mu$m, an aspect ratio of 2 and a copper exposed area in the range of 3–13%, averaging 7%, obtained by coating the surfaces of the copper powder used in Example 33 with silver by 10% by weight by a substitution plating method and thereafter following the same process as in Example 33, were added to 145 parts by weight of the resin composition obtained in Example 1 and uniformly mixed and dispersed by a mixing and grinding machine and a three-roll mill to obtain an electroconductive paste. The content of the flaky silver-coated copper powder and the unsteady-shaped silver-coated copper powder was 89% by weight based on the solids of the electroconductive paste. An electric circuit was made by following the same process as in Example 33 except that hot pressing was carried out under a pressure of 20 MPa, and its characteristics were evaluated. As a result, resistivity of the electric circuit was 8.3 $\mu\Omega$·cm. As a result of the thermal shock test of the electric circuit, the rate of change of resistivity was 5%. In the humidity and DC applied test of the interdigital electric circuit, the insulation resistance was $10^8$ $\Omega$ or more.

Example 36

By using the electroconductive paste obtained in Example 35, an electric circuit was made by following the same process as in Example 33 and then hot pressed by the heated rolls under the conditions of 100° C. and 10 MPa to densify the printed circuit, and its characteristics were evaluated. As a result, resistivity of the densified electric circuit was 8.4 $\mu\Omega$·cm. As a result of the thermal shock test of the densified electric circuit, the rate of change of resistivity was 4%. In the humidity and DC applied test of the interdigital electric circuit, the insulation resistance was $10^8$ $\Omega$ or more.

Comparative Example 4

400 parts by weight of the flaky silver-coated copper powder obtained in Example 33 was added to 145 parts by weight of the resin composition obtained in Example 1 and uniformly mixed and dispersed by a mixing and grinding machine and a three-roll mill to obtain an electroconductive paste. Then an electric circuit was made by following the same process as in Example 33 except for the hot pressing step, and its characteristics were evaluated. As a result, resistivity of the electric circuit was 62 $\mu\Omega$·cm. As a result of the thermal shock test of the electric circuit, the rate of change of resistivity was 10%. In the humidity and DC applied test of the electric circuit, the insulation resistance was $10^8$ $\Omega$ or more.

Comparative Example 5

400 parts by weight of a flaky silver powder having an aspect ratio of 8 and an average major particle diameter of 8 $\mu$m (trade name TCG-1 produced by Tokuriki Chemical Research Co., Ltd.) was added to 145 parts by weight of the resin composition obtained in Example 1 and uniformly mixed and dispersed by a mixing and grinding machine and a three-roll mill to obtain an electroconductive paste. Then an electric circuit was made by following the same process as in Example 33 except for the hot pressing step, and its characteristics were evaluated. As a result, resistivity of the electric circuit was 62 $\mu\Omega$·cm. As a result of the thermal shock test of the electric circuit, the rate of change of resistivity was 10%. In the humidity and DC applied test of the interdigital electric circuit, the insulation resistance dropped to $10^8$ $\Omega$ or less in 370 hours of test time, and there took place the migration of silver.

Comparative Example 6

To 145 parts by weight of the resin composition obtained in Example 1, 40 parts by weight of the copper powder coated with silver on the surface before being deformed into a flaky shape (the copper exposed area being less than 1%, almost 0%) obtained in Example 33 was added and uniformly mixed and dispersed by a mixing and grinding machine and a three-roll mill to obtain an electroconductive paste. Then an electric circuit was made by following the same process as in Example 33 except for the hot pressing step, and its characteristics were evaluated. As a result, resistivity of the electric circuit was 65 $\mu\Omega$·cm. As a result of the thermal shock test of the electric circuit, the rate of change of resistivity was 12%. In the humidity and DC applied test of the interdigital electric circuit, the insulation resistance dropped to $10^8$ $\Omega$ or less in 530 hours of test time, and there took place the migration of silver.

Industrial Applicability

According to the composite electroconductive powder of the present invention, it is possible to obtain an electroconductive paste for forming an electric circuit which is low in resistivity, high in electroconductivity and minimized in change of resistivity even after the thermal shock test and/or the humidity and DC applied test.

According to the composite electroconductive powder of the present invention, it is possible to obtain an electroconductive paste which is especially excellent in electroconductivity and also in oxidation resistance and heat resistance.

According to the composite electroconductive powder of the present invention, it is possible to obtain an electroconductive paste having an anchoring effect when pressed.

According to the composite electroconductive powder of the present invention, it is possible to obtain an electroconductive paste for forming an electric circuit which is low in resistivity, high in electroconductivity and also excellent in migration resistance.

According to the composite electroconductive powder of the present invention, it is possible to obtain an electroconductive paste which is low in resistivity, high in electroconductivity, minimized in change of resistivity even after the thermal shock test and/or the humidity and DC applied test, and capable of increasing probability of contact between the electroconductive powder particles, elevating electroconductivity of the electric circuit, and also raising electroconductivity especially when a circuit is printed on a sheet-like substrate and the printed circuit is pressed.

According to the composite electroconductive powder of the present invention, it is possible to obtain an electroconductive paste which is especially excellent in electroconductivity and also in oxidation resistance and heat resistance.

According to the composite electroconductive powder of the present invention, it is possible to obtain an electroconductive paste having an anchoring effect when pressed.

According to the composite electroconductive powder of the present invention, it is possible to obtain an electroconductive paste for forming an electric circuit which is low in resistivity, high in electroconductivity and also excellent in migration resistance.

The electroconductive paste of the present invention is suited for forming an electric circuit which is low in resistivity, high in electroconductivity and minimized in change of resistivity even after the thermal shock test and/or the humidity and DC applied test.

The electroconductive paste of the present invention is suited for forming an electric circuit which is low in resistivity, improved in probability of contact between the electroconductive powder particles, high in electroconductivity and also excellent in migration resistance.

The electric circuit of the present invention is low in resistivity, high in electroconductivity and excellent in migration resistance.

The electric circuit of the present invention is excellently suited for forming a fine circuit.

According to the electric circuit producing process of the present invention, it is possible to produce an electric circuit which is low in resistivity, high in electroconductivity and excellent in migration resistance.

According to the electric circuit producing process of the present invention, it is possible to produce an electric circuit which is excellently suited for forming a fine circuit.

We claim:

1. An electroconductive powder mixture comprising an electroconductive powder having an aspect ratio of 6 or greater and an electroconductive powder having an aspect ratio of 5 or less, both the electroconductive powder having an aspect ratio of 6 or greater and the electroconductive powder having an aspect ratio of 5 or less containing silver.

2. An electroconductive powder mixture according to claim 1, wherein the electroconductive powder having an aspect ratio of 6 or greater is a silver-coated conductor powder having an aspect ratio of 6 or greater.

3. A composite electroconductive powder mixture according to claim 2, wherein the silver-coated conductor powder having an aspect ratio of 6 or greater is a silver-coated copper powder or a silver-coated copper alloy powder.

4. An electroconductive powder mixture according to claim 3, wherein the silver-coated conductor powder having an aspect ratio of 6 or greater is a silver-coated copper powder or a silver-coated copper alloy powder in which the copper or copper alloy powder is partly exposed.

5. An electroconductive powder mixture according to claim 1, wherein the electroconductive powder having an aspect ratio of 5 or less is made of a conductor having a higher hardness than silver or silver alloys and coated with silver.

6. An electroconductive powder mixture according to claim 5, wherein the conductor having a higher hardness than silver or silver alloys is a powder of Co, Ni, Cr, Cu, W or an alloy thereof.

7. An electroconductive powder mixture according to claim 5, wherein the conductor having a higher hardness than silver or silver alloys is a copper powder or a copper alloy powder.

8. An electroconductive powder mixture according to claim 5, wherein the electroconductive powder having an aspect ratio of 5 or less, coated with silver, is a silver-coated copper powder in which the copper powder is partly exposed.

9. An electroconductive powder mixture according to claim 1, wherein the electroconductive powder having an aspect ratio of 6 or greater is contained in an amount of 95 to 50% by weight, and the electroconductive powder having an aspect ratio of 5 or less is contained in an amount of 5 to 50% by weight, a total being 100% by weight.

10. An electroconductive powder mixture according to claim 1 consisting essentially of the electroconductive powder having an aspect ratio of 6 or greater and the electroconductive powder having an aspect ratio of 5 or less.

11. An electroconductive powder mixture according to claim 10, consisting of the electroconductive powder having an aspect ratio of 6 or greater and the electroconductive powder having an aspect ratio of 5 or less.

12. An electroconductive powder mixture according to claim 1, wherein an average particle diameter of the electroconductive powder having an aspect ratio of 6 or greater is at most 25 $\mu$m, and an average particle diameter of the electroconductive powder having an aspect ratio of 5 or less is in a range of 3–20 $\mu$m.

13. An electroconductive powder mixture according to claim 1, wherein the silver is part of a silver alloy, the silver alloy being an alloy with palladium or platinum.

14. An electroconductive paste comprising the electroconductive powder mixture of claim 12, a binder and a solvent.

15. An electroconductive paste according to claim 14, wherein the electroconductive powder mixture is contained in an amount of 85–93% by weight based on the solids of the electroconductive paste.

16. An electroconductive paste according to claim 15, wherein said electroconductive powder mixture comprises the electroconductive powder having an aspect ratio of 5 or less an amount of 5–50% by weight and the electroconductive powder having a aspect ratio of 6 or greater in an amount of 95–50% by weight, a total being 100% by weight.

17. An electric circuit formed on a surface of a substrate by applying the electroconductive paste of claim 14 to the substrate.

18. An electric circuit according to claim 17, wherein resistivity of the electric circuit formed on the surface of a substrate is 25 $\mu\Omega$·cm or less.

19. An electric circuit formed on a surface of a substrate by applying the electroconductive paste of claim 15 the substrate.

20. An electric circuit according to claim 19, wherein the electric circuit has a resistivity of 25 $\mu\Omega$·cm or less.

21. An electric circuit formed on a surface of a substrate by applying the electroconductive paste of claim 16 to the substrate.

22. An electric circuit according to claim 21, wherein the electric circuit has a resistivity of 25 $\mu\Omega\cdot$cm or less.

23. A process for producing an electric circuit, which comprises forming a circuit pattern on a surface of a substrate with an electroconductive paste of claim 14, and then pressing and curing the paste.

24. A process for producing an electric circuit according to claim 23, wherein the electric circuit formed on the substrate surface has resistivity of 25 $\mu\Omega\cdot$cm or less.

25. A process for producing an electric circuit, which comprises forming a circuit pattern on a surface of a substrate with the electroconductive paste of claim 15, and then pressing and curing the paste.

26. A process according to claim 25, wherein the electric circuit has a resistivity of 25 $\mu\Omega\cdot$cm or less.

27. A process for producing an electric circuit, which comprises forming a circuit pattern on a surface of a substrate with the electroconductive paste of claim 16, and then pressing and curing the paste.

28. A process according to claim 27, wherein the electric circuit has a resistivity of 25 $\mu\Omega\cdot$cm or less.

* * * * *